(12) United States Patent
Ginawi et al.

(10) Patent No.: US 10,985,156 B2
(45) Date of Patent: Apr. 20, 2021

(54) ELECTROSTATIC DISCHARGE CLAMP WITH REDUCED OFF-STATE POWER CONSUMPTION

(71) Applicant: Marvell Asia Pte, Ltd., Singapore (SG)

(72) Inventors: Ahmed Y. Ginawi, South Burlington, VT (US); Andreas D. Stricker, Essex Junction, VT (US); Alain F. Loiseau, Williston, VT (US); Ephrem G. Gebreselasie, South Burlington, VT (US); Joseph M. Lukaitis, Pleasant Valley, NY (US); Richard A. Poro, III, Bristol, VT (US)

(73) Assignee: Marvell Asia Pte., Ltd., Singapore (SG)

( * ) Notice: Subject to any disclaimer, the term of this patent is extended or adjusted under 35 U.S.C. 154(b) by 518 days.

(21) Appl. No.: 15/866,999

(22) Filed: Jan. 10, 2018

(65) Prior Publication Data

US 2019/0214381 A1    Jul. 11, 2019

(51) Int. Cl.
*H01L 27/02* (2006.01)
*H02H 9/04* (2006.01)

(52) U.S. Cl.
CPC ...... *H01L 27/0266* (2013.01); *H01L 27/0285* (2013.01); *H01L 27/0292* (2013.01); *H01L 27/0296* (2013.01); *H02H 9/044* (2013.01); *H02H 9/046* (2013.01)

(58) Field of Classification Search
CPC ............ H01L 27/0248–0296; H02H 9/04–046
See application file for complete search history.

(56) References Cited

U.S. PATENT DOCUMENTS

| 3,601,625 A | * | 8/1971 | Redwine | H01L 27/0251 327/566 |
|---|---|---|---|---|
| 8,576,526 B2 | | 11/2013 | Chu et al. | |
| 8,643,987 B2 | | 2/2014 | Chu et al. | |
| 10,591,532 B2 | * | 3/2020 | Tatsumi | H01L 21/822 |
| 2010/0007407 A1 | * | 1/2010 | Trajkovski | H02M 3/07 327/536 |
| 2013/0215539 A1 | * | 8/2013 | Chu | H02H 9/046 361/56 |
| 2013/0293991 A1 | * | 11/2013 | Chu | H02H 9/046 361/56 |
| 2016/0094207 A1 | * | 3/2016 | Crandall | H03K 3/02 327/333 |
| 2017/0125085 A1 | * | 5/2017 | Kim | G11C 11/4074 |
| 2018/0019741 A1 | * | 1/2018 | Huang | H03K 17/0822 |

* cited by examiner

*Primary Examiner* — Jared Fureman
*Assistant Examiner* — Christopher J Clark

(57) ABSTRACT

The present disclosure relates to an electrostatic discharge (ESD) clamp and, more particularly, to an ESD clamp with reduced off-state power consumption. The structure includes: one or more inverters connected to a timing circuit; a first transistor receiving an output signal from a last of the one or more inverters and an output signal from the timing circuit; a second transistor with its gate connected to the first transistor, in series; and a voltage node providing a separate voltage to a gate of the second transistor.

18 Claims, 4 Drawing Sheets

ELECTROSTATIC DISCHARGE CLAMP WITH REDUCED OFF-STATE POWER CONSUMPTION

FIELD OF THE INVENTION

The present disclosure relates to an electrostatic discharge (ESD) clamp and, more particularly, to an ESD clamp with reduced off-state power consumption.

BACKGROUND

Electrostatic discharge (ESD) is the transfer of electrostatic charge between bodies at different electrostatic potentials (voltages). As is known, an ESD event can destroy and seriously impair IC devices, e.g., circuits used in handheld devices such as cellular telephones.

ESD protection devices are often built into IC devices in order to protect the various electronic components with the IC device. Providing ESD protection devices in handheld devices, e.g., cellular telephones, powered by battery are particularly challenging since these devices have to meet stringent power requirements.

RC-triggered power clamps (RC-Clamp) are typically used for ESD protection devices, particularly in handheld devices, e.g., cellular telephones. However, such clamps are large in size and also have high DC leakage, e.g., resulting in a gradual loss of energy. In handheld devices, e.g., cellular telephones, leakage can be problematic as it can drain the battery, amongst other problems.

SUMMARY

In an aspect of the disclosure, a structure comprises: one or more inverters connected to a timing circuit; a first transistor receiving an output signal from a last of the one or more inverters and an output signal from the timing circuit; a second transistor with its gate connected to the first transistor, in series; and a voltage node providing a separate voltage to a gate of the second transistor.

In an aspect of the disclosure, a structure comprises: a plurality of inverters which turn "ON" a transistor to protect a circuit during an electrostatic discharge (ESD) event; a second transistor which blocks a signal from the plurality of inverters to the transistor during normal circuit operations; and a negative voltage source which provides a negative voltage to the transistor to reduce leakage during the normal circuit operations.

In an aspect of the disclosure, a method comprises: turning "ON" a first transistor and a second transistor to protect a circuit during an ESD event; turning "OFF" the first transistor to block a signal to the second transistor from a plurality of inverters during normal circuit operations; and providing a negative voltage to the second transistor during the normal circuit operations to reduce leakage current.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to an electrostatic discharge (ESD) clamp and, more particularly, to an ESD clamp with reduced off-state power consumption. More specifically, the present disclosure provides an RC-triggered power clamp used for ESD protection devices. Advantageously, by implementing the ESD devices described herein, it is possible to have reduced RC-clamp leakage on a system level while still achieving adequate ESD protection (as in conventional ESD devices).

In embodiments, the ESD circuit described herein includes a plurality of inverters, where the last of the plurality of inverters is connected to a gate of a FET (p-type FET). The p-type FET is connected, in series, to the gate of the ESD clamp (also referred to as the "bigFET"), as well as a timing circuit. In addition, the ESD clamp is connected through a resistor to a negative voltage node. A multiplicity of clamps can share the same negative voltage node. During operation, a negative voltage at the system level (as provided by the negative voltage node) will be used to reduce the leakage.

Figure 1:
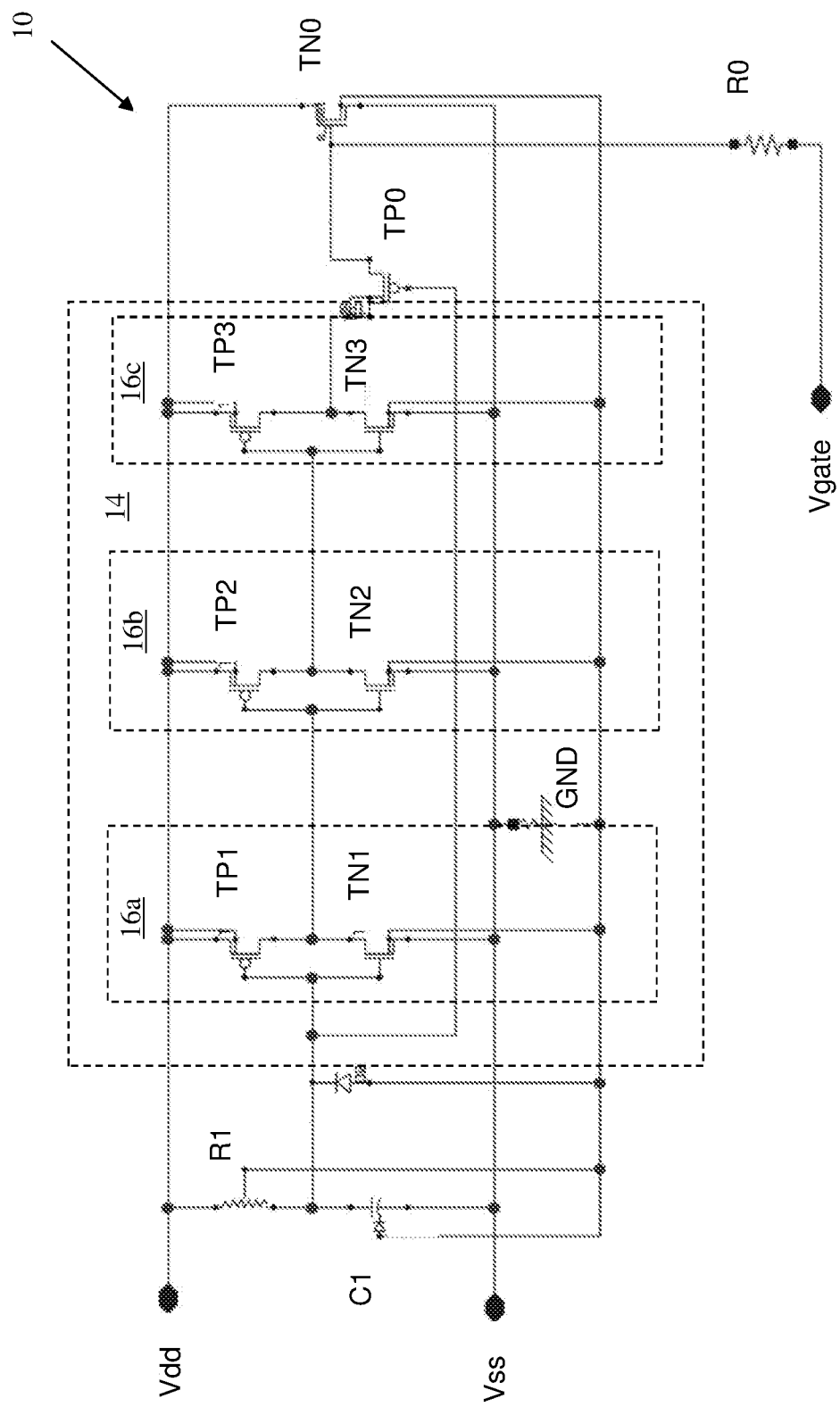
FIG. 1 shows a schematic diagram of an electrostatic discharge (ESD) protection circuit in accordance with aspects of the present disclosure.

FIG. 1 shows a schematic diagram of an electrostatic discharge (ESD) protection circuit in accordance with aspects of the present disclosure. In particular, the ESD protection device 10 (e.g., ESD clamping device) includes a resistor (R1)-capacitor (C1) timing circuit 12 for selectively turning on the ESD clamp TN0 during an ESD event. The timing circuit 12 is connected to Vdd and Vss. Although FIG. 1 shows a resistor R1 at the top of the RC timing circuit 12 and a capacitor C1 at the bottom of the RC timing circuit 12, it is understood that this is for exemplary purposes only, and that the capacitor C1 may be at the top of the RC timing circuit 12 and the resistor R1 may be at the bottom of the RC timing circuit 12.

Still referring to FIG. 1, an output of the RC timing circuit 12 is coupled to a trigger circuit 14 which comprises a plurality of inverters 16a, 16b and 16c. Although FIG. 1 shows three (3) inverters, it is understood that the trigger circuit 14 may include any number of inverters such that the output of the trigger circuit 14 is the opposite of the output of the RC timing circuit 12. As should be understood by those of ordinary skill in the art, the trigger circuit 14 generates a trigger pulse (not shown) for driving the ESD clamp TN0.

The inverters 16a, 16b, 16c each include a pair of FETS, in series. In particular, the plurality of FETs includes a p-type FET and a n-type FET, connected to Vdd and Vss. In a more specific example, the inverter 16a includes p-type FET, TP1, and n-type FET, TN1, inverter 16b includes p-type FET, TP2, and n-type FET, TN2, and inverter 16c includes p-type FET, TP3, and n-type FET TN3. In this way, the output of inverter 16a is fed as an input into the inverter 16b and, similarly, the output of the inverter 16b is fed as an input into the inverter 16c. Each of the inverters 16a, 16b, 16c are also connected to ground, GND and are gated between Vdd and Vss The ESD clamp 10 further includes a FET, TP0, e.g., p-type FET, in series with the trigger circuit 14, e.g., inverters 16a, 16b, 16c. In embodiments, the trigger circuit 14 generates a trigger pulse which is directly connected to the FET TP0. In embodiments, during an ESD event, for example, the FET TP0 is "ON" and the trigger pulse will drive ESD clamp TN0, e.g., n- type FET.

The ESD clamp TN0 is connected to GND and also a negative voltage source, Vgate. The negative voltage source, Vgate, is connected to the ESD clamp TN0 via a resistor R0. It should be understood that the negative voltage source, Vgate, can be connected to a multiplicity of clamps, i.e., sharing the same negative voltage node. During operation, the negative voltage at the system level will be used to reduce the leakage of the ESD clamp TN0 as described in detail herein.

In operation and under normal conditions (e.g., when there is no ESD event), the output of the RC timing circuit 12 is charged high, e.g., "1" from Vdd. The output signal "1" is provided as an input to the first inverter 16a, e.g., p-type, FET TP1, and the FET TP0. The input signal "1" will turn OFF the p-type FET TP1, disconnecting the clamp, e.g., FET TN0, from the trigger circuit 14. In addition, in the first inverter 16a, the FET TP0 will be turned OFF and the FET TN1 will be turned ON resulting in a low output signal "0" of the first inventor 16a. The low output signal "0" of the first inventor 16a is fed into the second inverter 16b. With this understanding and as should be understood by those of skill in the art, during normal conditions, the second inverter 16b will have a high output signal "1" which will be the input to the third inverter 16c. In turn, the third inverter 16c will have a low output signal "0", which is the opposite of the output of the RC timing circuit 12. The FET TP0 will be "OFF, blocking any signals from the inverter 16c. The ESD clamp TN0, e.g., n-type FET, will be OFF and a negative voltage will applied by the negative voltage source, Vgate. The negative voltage will, in turn, reduce the leakage of the ESD clamp TN0.

During an ESD event, the capacitor C1 of the RC timing circuit 12 will not have time to charge, resulting in a low output signal "0". This output signal "0" is fed into the first inverter 16a and the FET TP0. The low signal output "0" will turn ON the FET TP0 and connect the ESD clamp TN0, e.g., FET, to the trigger circuit 14. Also, the output of the inverter 16b will be a high signal "1", which is fed into the second inverter 16b. The output signal of the second inverter 16b will be a low signal "0", fed as an input into the third inverter 16c. In turn, the output of the third inverter is a high signal "1" which will turn ON the ESD clamp TN0, e.g., FET, to discharge the ESD event.

Figure 2:
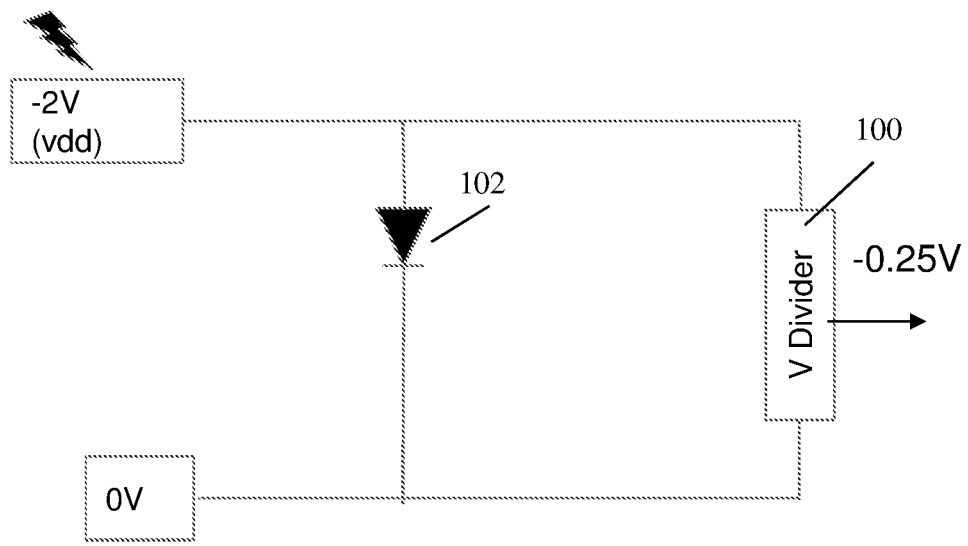
FIG. 2 shows a voltage divider provided on chip in accordance with aspects of the present disclosure.

FIG. 2 shows a circuit with a voltage divider provided on a chip. In embodiments, the voltage divider 100 will provide the negative voltage to the ESD clamp TN0. For example, a Vdd pad provided on the circuit, e.g., cellular telephone, can provide a voltage Vdd, e.g., of −2.0 V, to the voltage divider 100. The voltage divider 100 can divide the negative voltage to about −0.25 V, which is fed to the Vgate node. In embodiments, during an ESD event, when the voltage is larger than Vdd, e.g., larger than −2.0 V, the voltage can be discharged to ground, GND through diode 102. This voltage path will protect the voltage divider 100.

Figure 3:
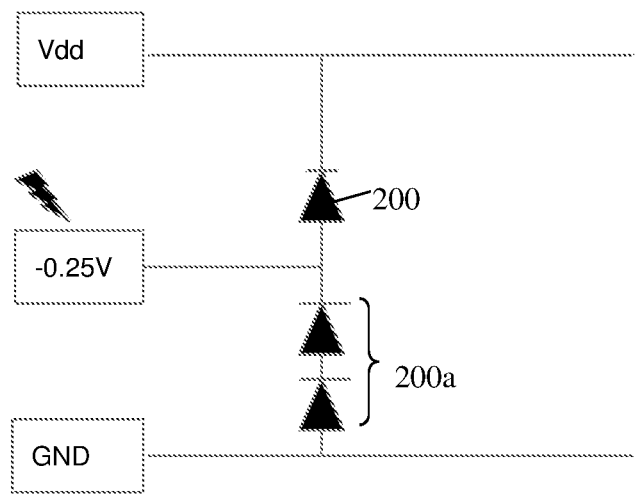
FIG. 3 shows a voltage divider provided off chip in accordance with aspects of the present disclosure.

FIG. 3 shows a circuit with a voltage divider provided off chip in accordance with aspects of the present disclosure. In this implementation, the off chip voltage, e.g., −0.25 V, can be fed to the Vgate node of FIG. 1. In embodiments, the circuit of FIG. 3 also includes an up diode 200 and two down diodes 200a. In embodiments, the up diode 200 will allow an ESD discharge to the RC clamp shown in FIG. 1. The two down diodes 200a, on the other hand, will provide a path to GND.

Figure 4:
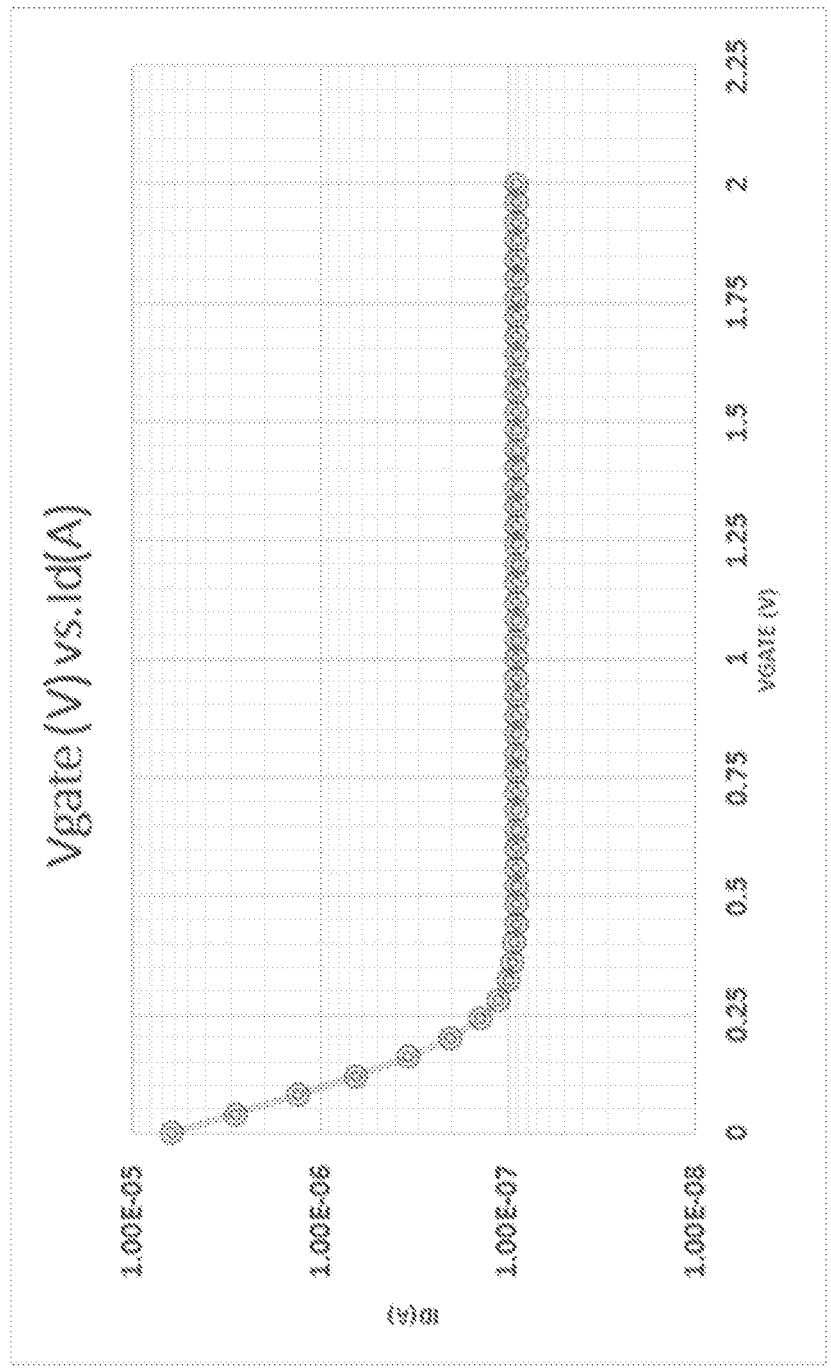
FIG. 4 shows a graph of leakage reduction of the clamp, e.g., FET TN0, when a negative voltage is applied by Vgate.

FIG. 4 shows a graph of leakage reduction of the ESD clamp TN0 when a negative voltage is applied by Vgate. In this graph, the x-axis represents voltage (V) at the Vgate and the y-axis represents leakage. As shown in the graph of FIG. 4, at a voltage of 0 V, the leakage is about 6.2 mA. In comparison, at a voltage of −0.25 V, the leakage drops to about 90 nanoamps. The leakage remains steady as the voltage increases, showing that a voltage of −0.25 V applied by the Vgate is optimal.

Figure 5:
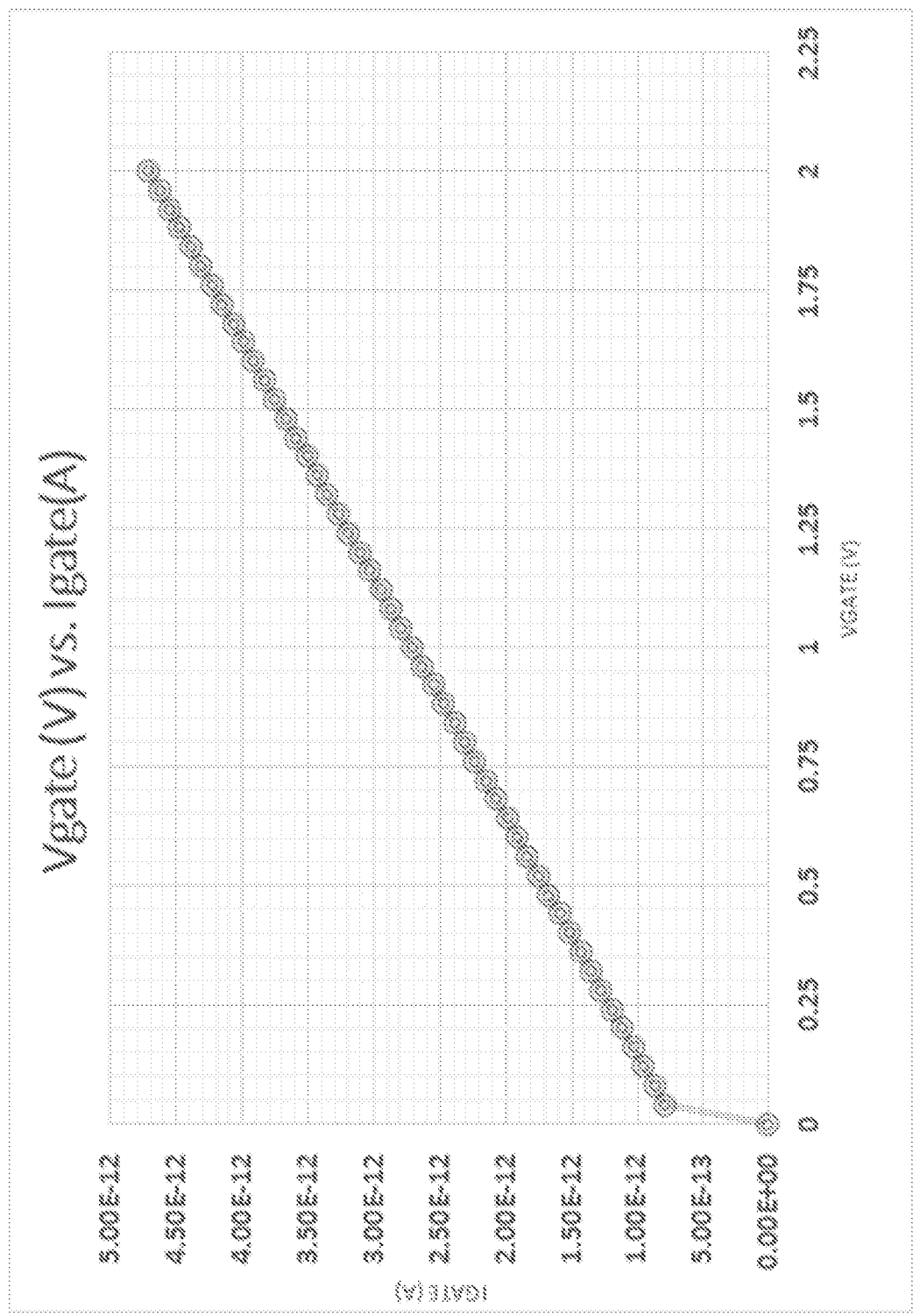
FIG. 5 shows a graph of leakage current on the Vgate.

FIG. 5 shows a graph of leakage on the Vgate. In this graph, the x-axis represents voltage (V) at the Vgate and the y-axis represents current. As shown in FIG. 5, the leakage at the Vgate at −0.25 V is negligible, i.e., about ⅓ picoamps of leakage.

The ESD clamp of the present disclosure can be manufactured in a number of ways using a number of different tools. In general, though, the methodologies and tools are used to form structures with dimensions in the micrometer and nanometer scale. The methodologies, i.e., technologies, employed to manufacture the ESD clamp of the present disclosure have been adopted from integrated circuit (IC) technology. For example, the structures are built on wafers and are realized in films of material patterned by photolithographic processes on the top of a wafer. In particular, the fabrication of the ESD clamp uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An electrostatic discharge (ESD) protection circuit comprising:
   one or more inverters connected to a timing circuit, wherein a first one of the one or more inverters receives, as an input signal, a first output signal from the timing circuit;

a first transistor that receives (i) a second output signal from a last of the one or more inverters and (ii) the first output signal from the timing circuit;

a second transistor, wherein a gate of the second transistor is connected to an output of the first transistor, in series; and a negative voltage source that outputs a voltage separate from the output of the first transistor to the gate of the second transistor; and a resistor directly connected between the negative voltage source and the gate of the second transistor.

2. The ESD protection circuit of claim 1, wherein the one or more inverters receive the input signal from the timing circuit and outputs, as a signal opposite to the input signal, the second output signal to the first transistor and the second transistor.

3. The ESD protection circuit of claim 1, wherein the negative voltage source comprises an on-chip voltage divider connected between the resistor and a pad.

4. The ESD protection circuit of claim 1, wherein the one or more inverters are an odd number of inverters connected in series with the first transistor.

5. The ESD protection circuit of claim 1, wherein the first transistor is a PFET and the second transistor is an NFET.

6. The ESD protection circuit of claim 1, wherein, during normal circuit operation, the first transistor is turned OFF, blocking the second output signal from the one or more inverters to the second transistor, and the negative voltage source provides a negative voltage to the gate of the second transistor.

7. The ESD protection circuit of claim 6, wherein, during the normal circuit operation, the first output signal from the timing circuit turns OFF the first transistor.

8. The ESD protection circuit of claim 1, wherein, during an ESD event, the first transistor is turned ON, the second output signal from the last of the one or more inverters turns ON the second transistor which protects the circuit from the ESD event.

9. The ESD protection circuit of claim 1, further comprising a multiplicity of clamps sharing the same negative voltage source.

10. An electrostatic discharge (ESD) protection circuit, comprising:

a plurality of inverters configured to output a first output signal to turn "ON" a first transistor to protect a circuit during an electrostatic discharge (ESD) event;

a second transistor which receives an input signal from a timing circuit and selectively blocks the first output signal from the plurality of inverters to the transistor during normal circuit operations based on the input signal received from the timing circuit; and a negative voltage source which provides a negative voltage to the first transistor to reduce leakage during the normal circuit operations; and a resistor directly connected between the negative voltage source and a gate of the first transistor such that the negative voltage is provided directly to the gate of the first transistor through the resistor.

11. The ESD protection circuit of claim 10, wherein the plurality of inverters receive the input signal from the timing circuit and outputs, as a signal opposite to the input signal, the first output signal to the first transistor.

12. The ESD protection circuit of claim 10, wherein the negative voltage source comprises an on-chip voltage divider connected between the resistor and a pad of the circuit to be protected.

13. The ESD protection circuit of claim 10, wherein the negative voltage source comprises an off-chip circuitry comprising an up diode and down diodes, which provides the negative voltage to the first transistor.

14. The ESD protection circuit of claim 10, wherein, during normal circuit operation, the second transistor is turned OFF by the input signal received from the timing circuit, blocking any signal from the plurality of inverters to the first transistor, and the negative voltage source provides the negative voltage to the first transistor.

15. The ESD protection circuit of claim 10, wherein, during the ESD event, the second transistor is turned ON, and the first output signal from a last one of the plurality of inverters is received by the first transistor to turn "ON" the first transistor to protect the circuit from the ESD event.

16. The ESD protection circuit of claim 10, further comprising a plurality of clamps sharing the same negative voltage source.

17. A method of operating an electrostatic discharge (ESD) protection circuit, the method comprising:

outputting, as an input signal to a first one of one or more inverters, a first output signal from a timing circuit;

outputting, from a last one of the one or more inverters, a second output signal to a first transistor and a second transistor;

providing the first output signal and the second output signal to the first transistor to selectively turn "ON" the first transistor and the second transistor to protect a circuit during an ESD event;

turning "OFF" the first transistor to block the second output signal from being provided to the second transistor during normal circuit operations; and providing a negative voltage to a gate of the second transistor during the normal circuit operations to reduce leakage current using a negative voltage source and a resistor directly connected between the negative voltage source and the gate of the second transistor.

18. The method of claim 17, wherein the negative voltage is about −0.25 V.

* * * * *